(12) United States Patent
Shim et al.

(10) Patent No.: US 7,298,026 B2
(45) Date of Patent: Nov. 20, 2007

(54) LARGE DIE PACKAGE AND METHOD FOR THE FABRICATION THEREOF

(75) Inventors: Il Kwon Shim, Singapore (SG); Jeffrey D. Punzalan, Singapore (SG); Keng Kiat Lau, Singapore (SG)

(73) Assignee: Stats Chippac Ltd., Singapore (SG)

( * ) Notice: Subject to any disclaimer, the term of this patent is extended or adjusted under 35 U.S.C. 154(b) by 233 days.

(21) Appl. No.: 11/126,052

(22) Filed: May 9, 2005

(65) Prior Publication Data
US 2006/0249830 A1 Nov. 9, 2006

(51) Int. Cl.
*H01L 23/495* (2006.01)
*H01L 21/00* (2006.01)
(52) U.S. Cl. .............. 257/666; 257/670; 257/787; 257/E23.031; 257/E23.037; 257/E23.049; 438/123
(58) Field of Classification Search ........ 257/666–677, 257/777, 778, 787, E23.031, E23.059; 438/111, 438/123, FOR. 366, FOR. 367, FOR. 377, 438/FOR. 380
See application file for complete search history.

(56) References Cited

U.S. PATENT DOCUMENTS

| | | | |
|---|---|---|---|
| 6,638,790 B2 | 10/2003 | Minamio et al. | |
| 6,825,062 B2 | 11/2004 | Yee et al. | |
| 6,825,249 B1 | 11/2004 | Takeda et al. | |
| 2003/0001252 A1* | 1/2003 | Ku et al. | 257/686 |
| 2004/0262718 A1* | 12/2004 | Ramakrishna | 257/666 |
| 2005/0156292 A1* | 7/2005 | Paek | 257/666 |

* cited by examiner

*Primary Examiner*—Jasmine Clark
(74) *Attorney, Agent, or Firm*—Mikio Ishimaru (57) ABSTRACT

A method for fabricating a large die package with a lead-frame having leads and a paddle is provided. An interposer is attached onto the leadframe with the interposer extending over at least a portion of the paddle and at least a portion of the leads of the lead-frame. The interposer is insulated from the leads. A die is attached to the interposer.

16 Claims, 6 Drawing Sheets

LARGE DIE PACKAGE AND METHOD FOR THE FABRICATION THEREOF

TECHNICAL FIELD

The present invention relates generally to integrated circuits, and more particularly to small footprint packages for large dies and methods for the fabrication thereof.

BACKGROUND ART

Reducing the size of electronic devices while increasing performance and speed is a continuing objective in the electronics industry. Electronic system manufacturers continue to demand components with higher performance and reliability along with reduced physical sizes and manufacturing costs. To accomplish this, increased miniaturization of integrated circuit ("IC") packages is becoming increasingly essential. In response, modern requirements for IC packaging are increasingly oriented toward smaller and thinner packages having ever higher numbers of input/output ("I/O") terminals.

IC packages for complex electronic systems typically incorporate one or more interconnected IC chips or dies, which are usually made from a semiconductor material such as silicon ("Si") or gallium arsenide ("GaAs"). A variety of semiconductor devices may be formed in various layers on the dies using photolithographic techniques. After manufacture, the dies are typically incorporated into packages that are then mounted on printed circuit boards.

Die packages typically have numerous external pins that are mechanically attached to conductor patterns on the printed circuit boards by soldering or other known techniques. Typically, the packages in which these dies are mounted include a substrate or other die-mounting device. One example of such a substrate is a leadframe. High-performance leadframes may encompass multi-layer structures including power, ground, and signal layers on separate planes.

IC dies may be attached to a leadframe by an adhesive, or by other commonly employed techniques such as soldering. A number of power, ground, and/or signal leads are then attached to power, ground, and/or signal sites on the die.

Once a die is attached mechanically and electrically to the leadframe, the leadframe may be enclosed or encapsulated in a protective enclosure such as plastic, or a multi-part housing made of plastic, ceramic, or metal. The enclosure helps to protect the leadframe and the attached die from physical, electrical, moisture, and/or chemical damage.

The leadframe and attached die may then be mounted, for example, on a circuit board or circuit card, typically with other leadframes or devices, for incorporation into any of a wide variety of end products.

Typical known leadframes that include a number of layers on different planes are complex and expensive to produce. Multiple planes have nevertheless been incorporated into the design of many leadframes in order to accommodate the high density of leads needed for the highly complex dies typically used today.

Another solution for providing a high density of leads is a multiple-row leadframe in which independent inner and outer rows of leads are provided in a common plane. One such configuration, for example, provides a dual-row pattern in which an inner row of leads is surrounded by an outer row, either in staggered or in-line configurations.

"Leadless" packages are becoming increasingly important as component and circuit designs become ever smaller and smaller. In such leadless packages, the internal leads of the leadframe terminate as contacts on the exterior surface of the package rather than as external wires or leads extending outwardly from the package surface. In this manner, some of the contacts, for example those coming from the internal inner row leads, can be located on the package surface inwardly and away from the package edge. This positions the inner row contacts away from other contacts that are on the package edge (such as, for example, contacts from the outer row leads). More contacts can thus be accommodated without requiring a larger and longer package edge, since not all the contacts are crowded together at the package edge.

One such leadless package is a quad flat no lead ("QFN") package. QFN packages with higher numbers of input and output ("I/O") connections in the same or smaller body sizes are increasingly important for successful and competitive end-product designs. One key factor that is helping to achieve the higher number of I/Os in compact end-product designs is a dual-row QFN package internal lead arrangement. These designs have inner row leads and outer row leads (either staggered or in-line), usually in the same plane.

Unfortunately, increased miniaturization creates conflicts where older-generation IC dies of larger proportions need to be converted in order to fit into smaller IC package configurations (e.g., into QFN packages). ("Large die", in this case, thus refers to a die that is large enough to overlap the leads of the leadframe.) Often, the larger sizes of these older-generation dies simply cannot be reduced enough to accommodate this conversion.

One solution for accommodating larger dies has been to mount them on newer, smaller-sized leadframes with a non-conductive adhesive film layer positioned between each die and its leadframe. The non-conductive film insulates the large die from the inner leads of the small leadframe where the die overlaps the inner leads of the leadframe.

A difficulty with this solution is that the film and the film adhesive insulate the die both electrically and thermally from the die paddle on the leadframe. Ordinarily, a die is bonded onto the die paddle of a leadframe by use of a die-bonding material such as a gold-silicon ("Au—Si") eutectic, solder, resin paste, or the like. The die paddle then ordinarily performs several functions: it physically supports the die, and it provides both an electrical ground and a thermal sink for the die. In fact, in many package designs the leadframe die paddle is exposed on the package exterior to enhance the thermal dissipation capability for the die. But when such an adhesive film configuration is used for adapting small packages for use with such large dies, the ground pad and the thermal dissipation functions of the die paddle are effectively defeated.

Miniaturization causes other problems as well. For example, as the leadframe elements become smaller and smaller in such designs, they also unfortunately become thinner and less robust, which makes them increasingly susceptible to displacement, such as bending or tilting, while they are being encapsulated. The inner leads, in particular, which are weaker than the outer leads, are increasingly likely to be displaced in this manner by the molding compound as the compound flows over and through the leadframe during the molding process. This displacement moves and lifts the leads from their proper positions and allows the molding compound to seep under the leads, causing mold flash underneath the pad terminals. This in turn causes the leads to be partially or completely covered with the molding compound at the package surface, which results in a defective package.

Thus, a need remains for leadframe designs, configurations, and manufacturing methods that will provide die paddle electrical ground and thermal sink for large dies, and will maintain the leadframe leads in their proper positions during the flow of the molding compound in the package molding process. In view of the ever-decreasing sizes of leadframes, the ever-increasing numbers of leads on such leadframes, and the persistent need to reduce costs and increase efficiencies, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for fabricating a large die package. A leadframe having leads and a paddle is provided. An interposer is attached onto the leadframe with the interposer extending over at least a portion of the paddle and at least a portion of the leads of the leadframe. The interposer is insulated from the leads. A die is attached to the interposer.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known configurations and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
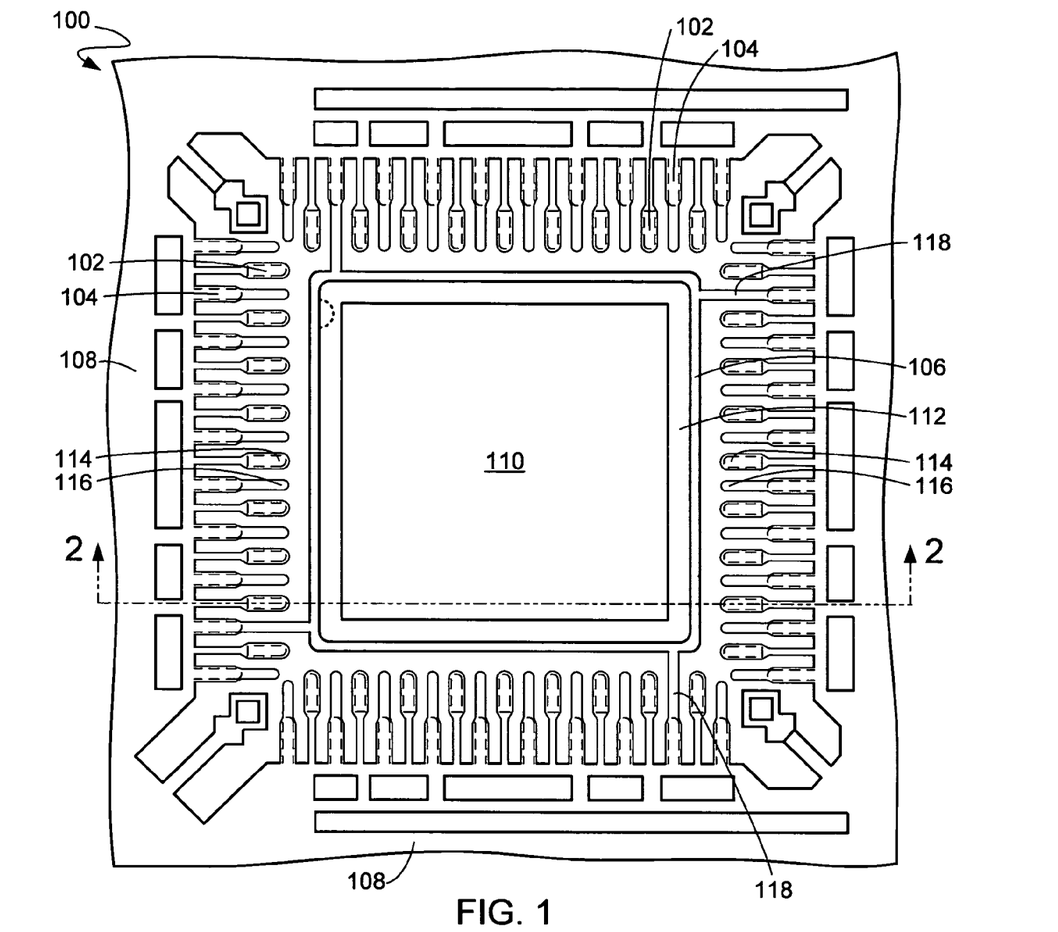
FIG. 1 is a view of a semiconductor die mounted on the die paddle of a leadframe having inner and outer leads.

Referring now to FIG. 1, therein is shown a leadframe matrix 100 having inner leads 102, outer leads 104, and a paddle 106 supported conventionally on matrix rails 108 prior to singulation of the leadframe therefrom. The paddle 106 supports a die 110 that is attached thereon by an epoxy 112. The die 110 may be any suitable integrated circuit ("IC") chip or die, and the epoxy 112 may alternatively be any other suitable adhesive or attachment medium (e.g., solder), as is known in the art.

The inner leads 102 terminate in lead tips 114, and the outer leads 104 terminate in lead tips 116. Tie bars 118 connect the paddle 106 to the outer portions of the leadframe matrix 100, such as, for example, to the outer leads 104.

Figure 2:
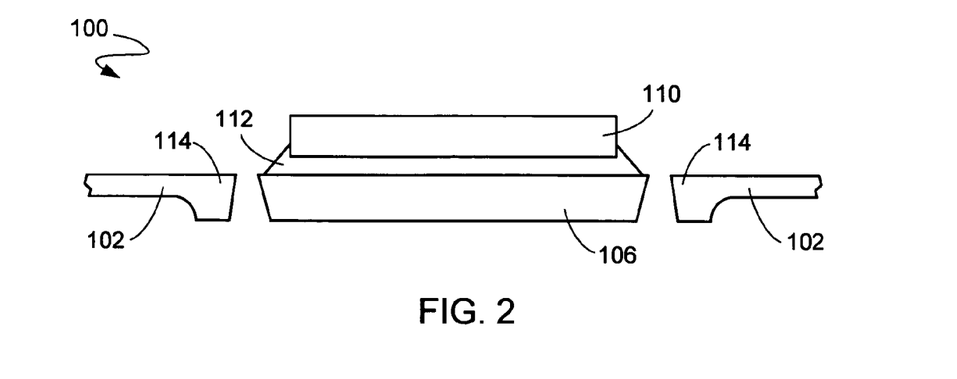
FIG. 2 is a cross-sectional view of the structure of FIG. 1 taken along line 2-2 thereof.

Referring now to FIG. 2, therein is shown a cross-sectional view of the leadframe matrix 100 (FIG. 1) taken on line 2-2 in FIG. 1.

Figure 3:
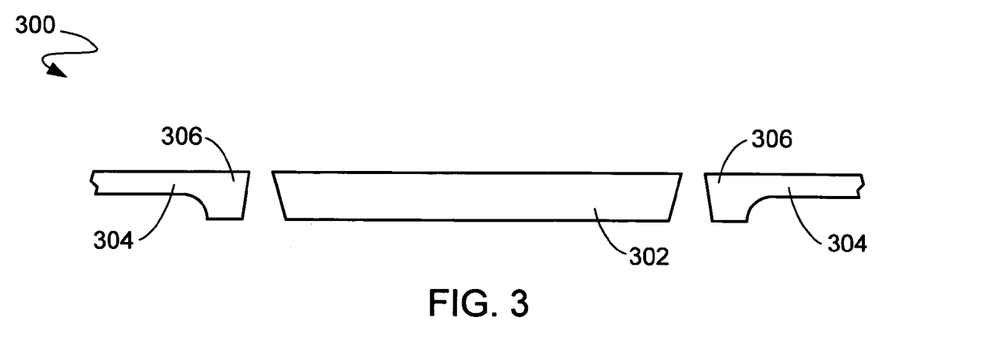
FIG. 3 is a view of a portion of a leadframe in an early stage of fabrication of an integrated circuit package.

Referring now to FIG. 3, therein is shown a portion of a leadframe 300, similar to the inner portions of the leadframe matrix 100 (FIG. 1), at an early stage in the fabrication of an IC package. The leadframe 300 includes a paddle 302 and inner leads 304 that terminate at lead tips 306 adjacent the paddle 302.

Figure 4:
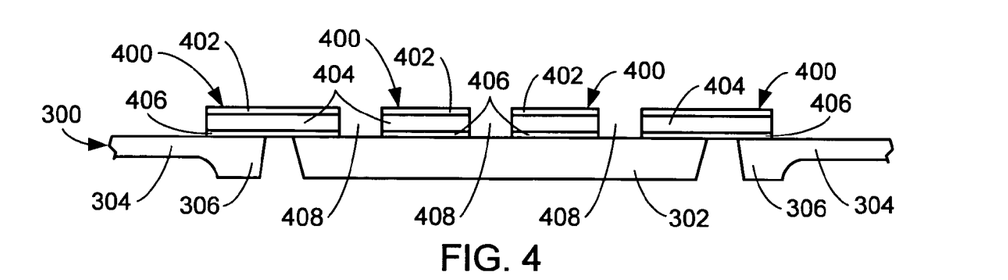
FIG. 4 is the structure of FIG. 3 after attachment of an interposer thereto.

Referring now to FIG. 4, therein is shown the structure of FIG. 3 following attachment of an interposer 400 onto the leadframe 300. The interposer 400, which in this embodiment is composed of several layers, is electrically insulative, has lateral dimensions slightly larger than a die (such as the die 602, FIG. 6) that is to be mounted thereon, and is considerably more robust than a mere layer of adhesive film. The interposer 400 in this embodiment is also larger than the paddle 302 and extends over the lead tips 306. The several layers of the interposer 400 include an adhesive layer 402 on the top thereof, an intermediate layer 404 immediately beneath the adhesive layer 402, and an adhesive layer 406 on the bottom thereof. The adhesive layer 406 is an electrically insulating layer that is between, and attaches, the intermediate layer 404 to the leadframe 300 and to the lead tips 306.

The adhesive layers 402 and 406 may be, for example, any suitable adhesive ordinarily known and employed for securing dies and/or films to leadframes. The intermediate layer 404, which is more robust than a layer of adhesive film, may be, for example, a polyimide, a ceramic, or a metallic material according to the characteristics and functionalities desired in the finished IC package, as discussed more particularly hereinbelow.

The interposer 400 also includes several through-holes 408 that pass therethrough from the top to the bottom thereof, thereby penetrating all three of the layers 402, 404, and 406. In one embodiment, the interposer 400 is pre-punched with the through-holes 408. The shapes of the through-holes 408 can be any appropriate shapes (e.g., circular, oval, square, rectangular, star, hexagon, octagon, and so forth) according to the needs at hand. Similarly, the patterns of the through-holes 408 can be any appropriate patterns (e.g., parallel rows, staggered rows, circles, concentric circles, ovals, embedded and/or overlapping polygons, and so forth) according to the needs at hand.

Figure 5:
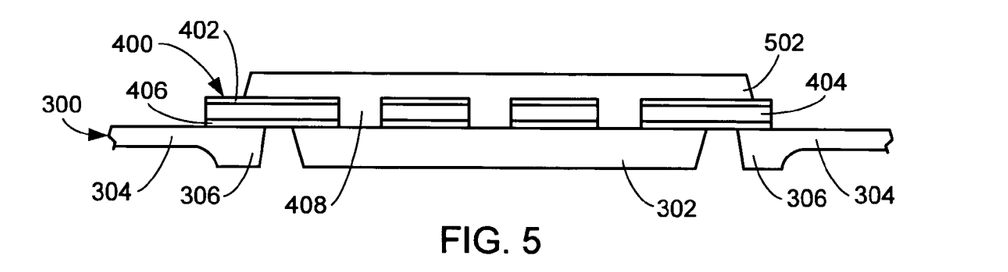
FIG. 5 is the structure of FIG. 4 after attachment of an epoxy to the interposer.

Referring now to FIG. 5, therein is shown the structure of FIG. 4 following the attachment of an epoxy 502 to the top of the interposer 400 and to the top of the paddle 302 in the areas thereof exposed by the through-holes 408. The epoxy 502 may be any known, suitable epoxy ordinarily employed, for example, for securing IC dies onto leadframe paddles.

Figure 6:
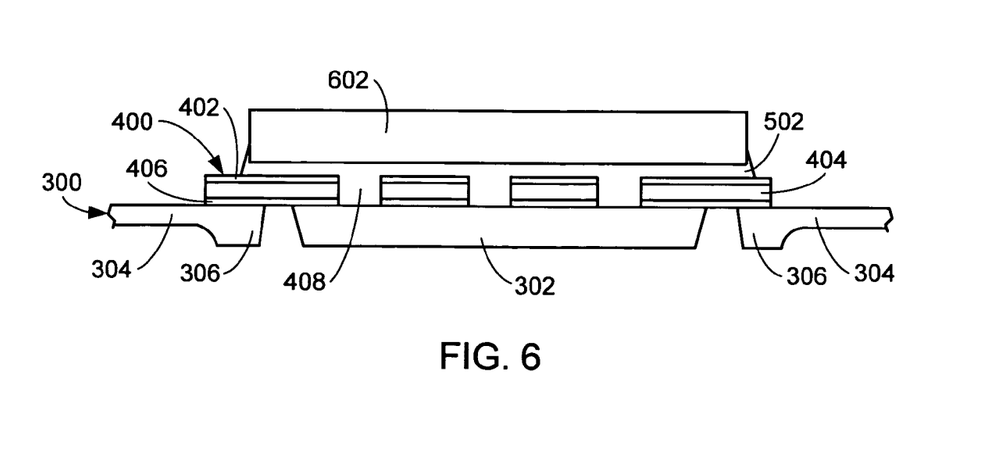
FIG. 6 is the structure of FIG. 5 after attachment of a die onto the epoxy.

Referring now to FIG. 6, therein is shown the structure of FIG. 5 following attachment of a die 602 onto the epoxy 502 above the interposer 400. The die 602 is an IC that is larger than the paddle 302. In fact, the die 602 extends laterally somewhat over the lead tips 306 of the inner leads 304. ("Large die", in this case, thus refers to a die that is large enough to overlap the leads of the leadframe.) However, the interposer 400 separates the die 602 from the inner leads 304, thereby electrically insulating the die 602 therefrom. By virtue of the through-holes 408, however, the paddle 302 is able to afford thermal dissipation for the die 602 by employing an epoxy 502 that is thermally conductive, thereby conducting heat away from the die 602 to the paddle 302 through the through-holes 408.

The material and dimensions of the intermediate layer 404 are selected to provide the necessary and desirable supporting strength between the die 602 and the paddle 302, notwithstanding the presence of the through-holes 408. Further, the material of which the intermediate layer 404 is composed may be selected to further facilitate such heat transfer (for example, by choosing a metallic material).

Figure 7:
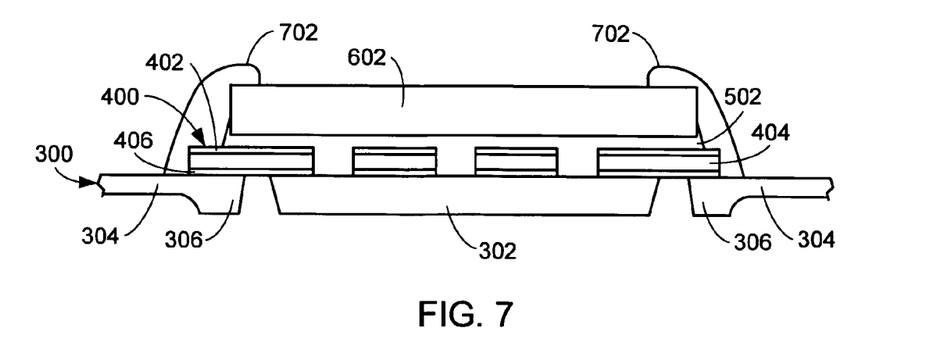
FIG. 7 is the structure of FIG. 6 after wire bonding the die to the inner leads of the leadframe.

Referring now to FIG. 7, therein is shown the structure of FIG. 6 following wire bonding of the die 602 to the leadframe 300, and in particular, to the inner leads 304, by means of wires 702.

Figure 8:
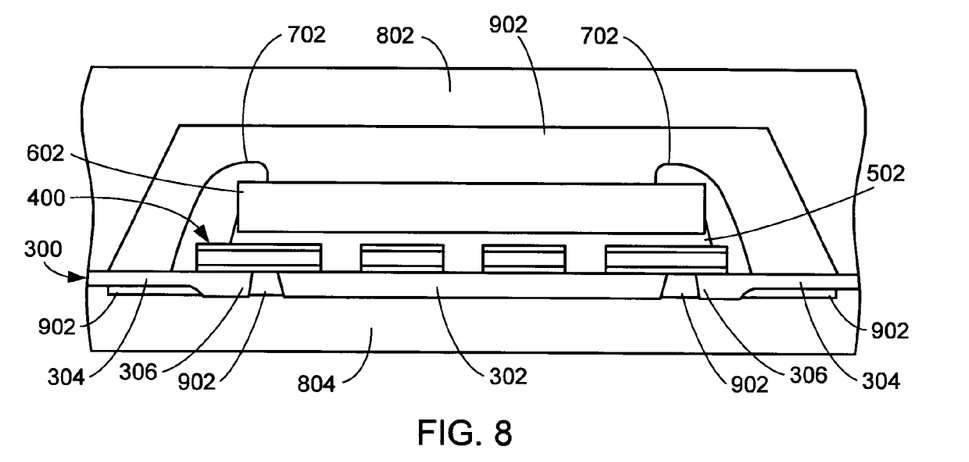
FIG. 8 is the structure of FIG. 7 in a mold prior to encapsulation into a finished package.

Referring now to FIG. 8, therein is shown the structure of FIG. 7 located between an upper mold section 802 and a lower mold section 804 prior to injection of a mold compound for encapsulating the structure of FIG. 7 into a finished package.

Figure 9:
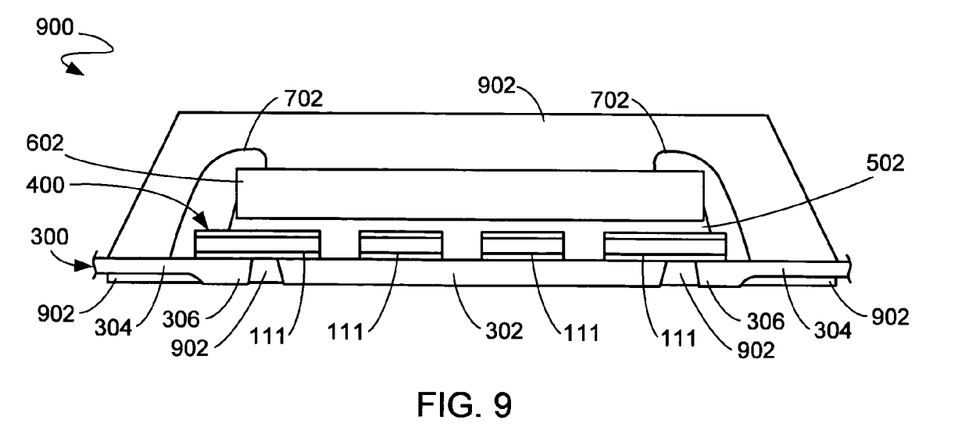
FIG. 9 is a view of the structure of FIG. 7 after encapsulation to form a package.

Referring now to FIG. 9, therein is shown a package 900 which is the finished package formed of the structure shown in FIG. 7 after encapsulation in a molding compound 902 in accordance with the molding step illustrated in FIG. 8.

The package 900 thus successfully packages a die, such as the die 602, that is a large die relative to the leadframe 300 on which it is supported. ("Large die", in this case, refers to a die that is large enough to overlap the leads of the leadframe.) It has been discovered, according to the present invention, that an interposer, such as the interposer 400, makes it possible to accommodate a large die, such as the die 602, on a smaller leadframe, such as the leadframe 300. The invention thus enables older, "legacy" dies of larger sizes to be successfully supported on, and to interface with, newer, smaller leadframe and package profiles without loss or sacrifice of thermal dissipation and electrical functionality.

Figure 10:
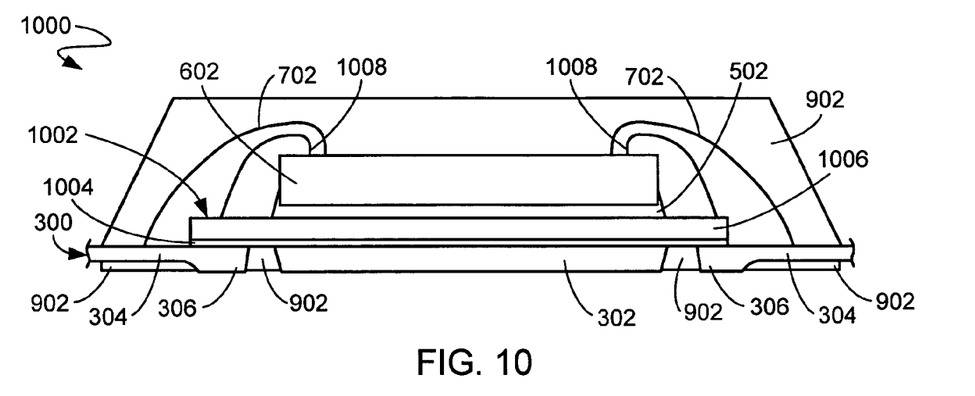
FIG. 10 is a view of a package, similar to the package of FIG. 9, incorporating another embodiment of the present invention.

Referring now to FIG. 10, therein is shown a package 1000 similar to the package 900 (FIG. 9), but incorporating another embodiment of the present invention. In the package 1000, an interposer 1002 is composed of an electrically insulating adhesive layer 1004 and a metal layer 1006. The interposer 1002 has lateral dimensions slightly larger than the die 602 that is mounted thereon. The interposer 1002 is also larger than the paddle 302 and extends over the lead tips 306. The electrically insulating adhesive layer 1004 is situated between and attaches the leadframe 300 and the metal layer 1006, including adhering the metal layer 1006 to the lead tips 306 while electrically insulating the interposer 1002 therefrom.

The metal layer 1006, which is more robust than a layer of adhesive film, is a finished bondable metal layer of, for example, gold ("Au"), silver ("Ag"), palladium ("Pd"), and so forth as appropriate to the particular configuration at hand. As in the embodiment shown in the package 900, the interposer 1002 is thus positioned on the leadframe 300 between the leadframe 300 and the die 602, which is attached to the interposer 1002 by the epoxy 502. The metal layer 1006 of the interposer 1002 substantially enhances the heat transfer capability of the interposer 1002, thereby significantly improving the thermal dissipation of the package 1000 for conducting heat from the die 602 out of the package 1000 through the paddle 302 of the leadframe 300.

A significant advantage of the package 1000 is that the metal layer 1006 of the interposer 1002 can provide a ground bond and/or die backside ground in the package 1000. Thus, since the electrically insulating adhesive layer 1004 is an insulating layer, the metal layer 1006 can be connected to a ground potential source (not shown). Ground bond wires 1008 can then be connected directly from the die 602 to the grounded metal layer 1006. Similarly, the epoxy 502 may be an electrically conductive epoxy, thereby providing a die backside ground for the die 602, notwithstanding that the die 602 is separated and electrically insulated from the paddle 302 by the electrically insulating adhesive layer 1004.

Figure 11:
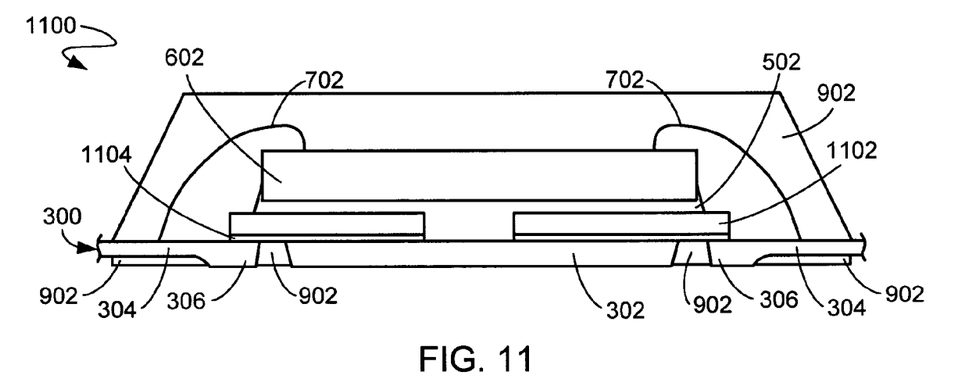
FIG. 11 is a view of a package with a perforated interposer secured on top of the leadframe.

Referring now to FIG. 11, therein is shown a package 1100 having an interposer 1102 secured on top of the leadframe 300 by an electrically insulating adhesive layer 1104 therebetween. The interposer 1102 has lateral dimensions slightly larger than the die 602 that is mounted thereon and extends over the lead tips 306. The interposer 1102, which is more robust than a layer of adhesive film, may be a perforated layer of a polyimide, a ceramic, or a metal, as appropriate to the needs at hand. The electrically insulating adhesive layer 1104 also attaches the interposer 1102 to the lead tips 306 while electrically insulating the interposer 1102 therefrom.

One or more through-holes 1106 pass through the interposer 1102 and the electrically insulating adhesive layer 1104 therebeneath, allowing the epoxy 502 to directly contact the paddle 302. Since the epoxy 502 is also in contact with and adhered to the bottom of the die 602, the epoxy 502 is able to provide thermal and electrical conductivity directly to the paddle 302, depending upon the physical characteristics of the epoxy 502 that has been selected. That is, in one embodiment, the epoxy 502 will be both thermally and electrically conductive; and in another embodiment, for example, the epoxy 502 will be thermally conductive but electrically insulating.

Figure 12:
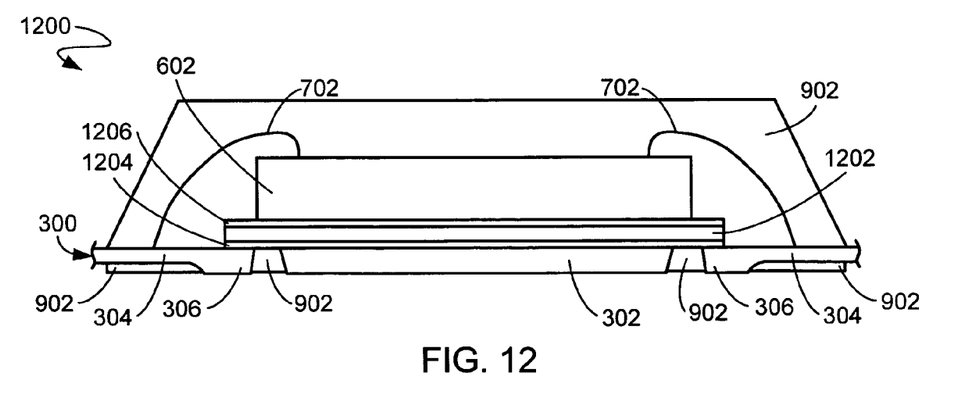
FIG. 12 is a view of a package with an interposer between lower and upper adhesive layers.

Referring now to FIG. 12, therein is shown a package 1200 having an interposer 1202 located between a lower electrically insulating adhesive layer 1204 and an upper adhesive layer 1206 formed on the interposer 1202. The lower electrically insulating adhesive layer 1204 attaches the interposer 1202 to the paddle 302, while the upper adhesive layer 1206 attaches the die 602 to the interposer 1202. The interposer 1202 has lateral dimensions slightly larger than the die 602 that is mounted thereon and extends over the lead tips 306. The interposer 1202, which is more robust than a layer of adhesive film, may be, for example, a layer of polyimide, ceramic, or metal, according the needs at hand. The lower electrically insulating adhesive layer 1204 also adheres the interposer 1202 to the lead tips 306 while electrically insulating the interposer 1202 therefrom. Advantageously, the interposer 1202 thus provides a consistent plane for a large die, such as the die 602, preventing die tilting. The interposer 1202 also ensures that the lead tips 306 are not bent upward, and provides one step film attaching. Electrical ground connections can be done on the tie bars (or fused leads) 118 (FIG. 1).

Figure 13:
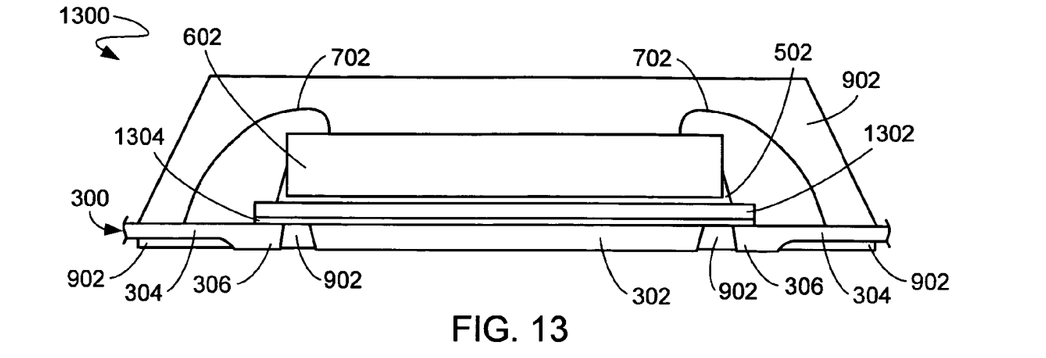
FIG. 13 is a view of a package with an interposer secured to the paddle by an adhesive layer.

Referring now to FIG. 13, therein is shown a package 1300 having an interposer 1302 attached by an electrically insulating adhesive layer 1304 to the paddle 302. The interposer 1302, which is more robust than a layer of adhesive film, has lateral dimensions slightly larger than the die 602 that is mounted thereon, and extends over the lead tips 306. The electrically insulating adhesive layer 1304 also adheres the interposer 1302 to the lead tips 306. Unlike the interposer 1002 (FIG. 10), however, the interposer 1302, which is a layer of polyimide, ceramic, or metal, is not grounded, and therefore does not provide for wire ground bonds or die backside grounding. Rather, the embodiment of the invention shown in the package 1300 provides functionality similar to the embodiment shown in the package 1200 (FIG. 12), except that the epoxy 502 secures the die 602 to the interposer 1302, rather than being secured by an upper adhesive layer such as the upper adhesive layer 1206 (FIG. 12). Advantageously, the interposer 1302 thus provides for no film sagging between the lead tips 306 and the paddle 302. The interposer 1302 also ensures that the lead tips 306 are not bent upward, and affords better thermal conductivity by providing for electrical ground connection on the tie bars 118 (FIG. 1).

Figure 14:
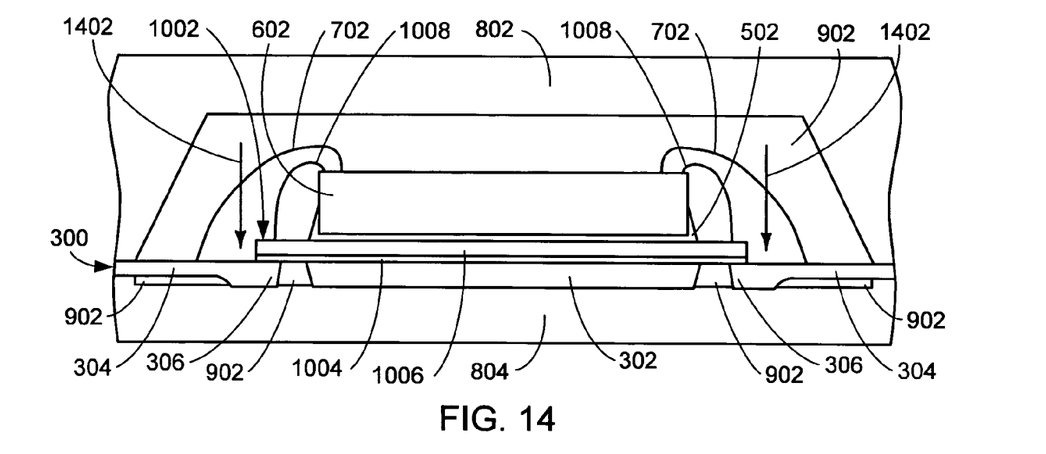
FIGS. 14, 15, and 16 are views of the structures of FIGS. 10, 11 and 12 during molding thereof into packages.
Figure 15:
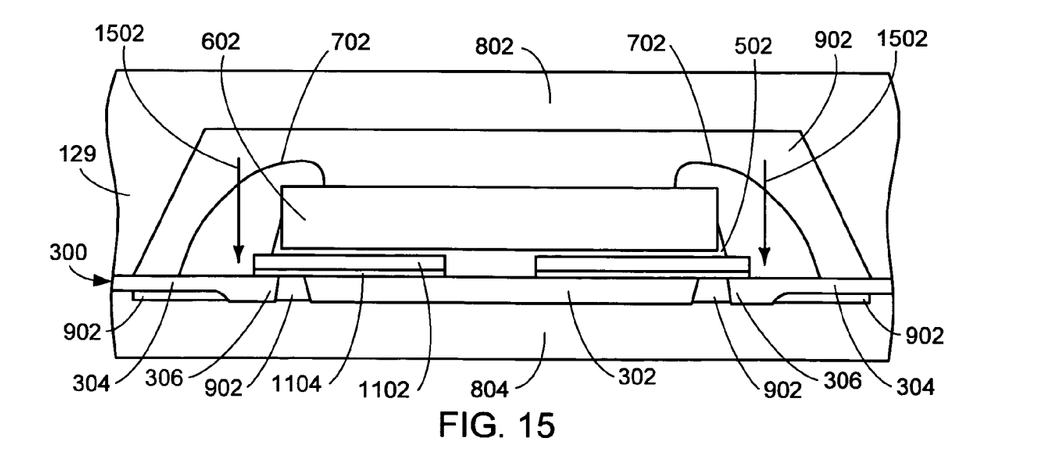
Figure 16:
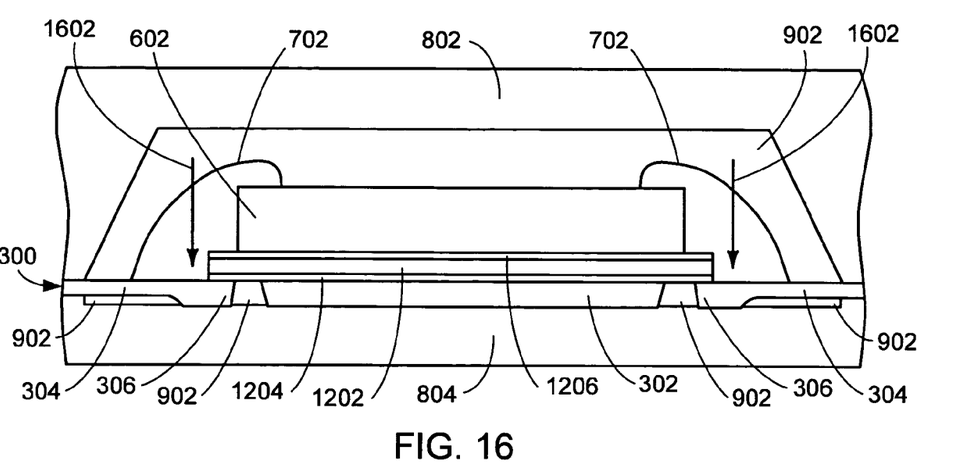

Referring now to FIGS. 14, 15, and 16, therein are shown, respectively, the packages 1000 (FIG. 10), 1100 (FIG. 11), and 1200 (FIG. 12) during molding thereof in the upper mold section 802 and the lower mold section 804. The overhangs of the respective interposers 1002, 1102, and 1202 are adhered to the lead tips 306 of the inner leads 304 by their respective electrically insulating adhesive layers, 1004, 1104, and 1204. In addition, the weights of the interposers 1002, 1102, and 1202, respectively, and of the dies 602 thereon, reinforced by adhesion to the paddle 302, combine to create a downward force on the lead tips 306, as indicated by the respective arrows 1402, 1502, and 1602.

The adhesion of the overhangs and the downward forces combine to hold the inner leads 304 and the lead tips 306 in their correct positions during molding of the packages 1000, 1100, and 1200, and particularly, during the flow of the molding compound 902 into the cavity in the upper and lower mold sections 802 and 804. Thus, the support of the respective electrically insulating adhesive layers, 1004, 1104, and 1204, of the interposers, 1002, 1102, and 1202, and of the dies 602, together, prevent the inner leads 304 from being moved by turbulent flow of the molding compound 902 during molding of the packages 1000, 1100, and 1200. The inner leads 304 are thus not displaced from their proper positions, and accordingly, the molding compound 902 does not seep under the inner leads 304 to cause mold flash underneath the pad terminals. Accordingly, the present invention further facilitates successful miniaturization of such increasingly complex IC packages.

It has thus been discovered, and will now be clear to one of ordinary skill in the art upon reading the above disclosure, that interposers according to the present invention may include integral adhesive layers on both sides, one side, or neither side, depending upon the particular configurations chosen for a particular application at hand. Adhesive can thus be provided as an integral part of the interposer, or adhesive can be provided separately, as may be considered appropriate and desirable for the particular configuration and assembly processes at hand.

Figure 17:
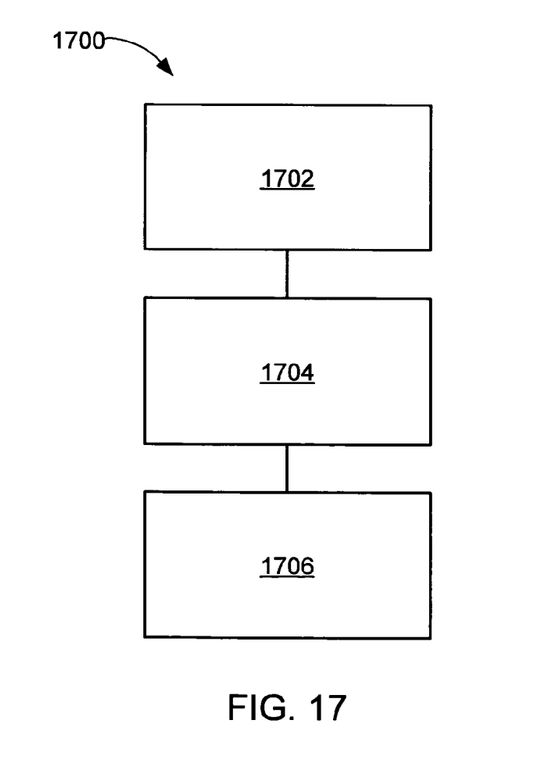
FIG. 17 is a flow chart of a method for fabricating a large die package in accordance with an embodiment of the present invention.

Referring now to FIG. 17, therein is shown a flow chart of a method 1700 for fabricating a large die package in accordance with an embodiment of the present invention. The method 1700 includes providing a leadframe having leads and a paddle in a block 1702; attaching an interposer onto the leadframe with the interposer extending over at least a portion of the paddle and at least a portion of the leads of the leadframe, with the interposer insulated from the leads, in a block 1704; and attaching a die to the interposer in a block 1706.

It has been discovered that the present invention thus has numerous advantages.

A principle advantage is that the present invention provides a highly efficient, effective, and economical solution for small packages that incorporate large dies.

Another advantage is that the present invention provides such solutions for small packages that incorporate large dies that also require a ground pad while overhanging the leadframe leads.

Another advantage is that the invention can be applied not only to QFN packages, but to a wide range of package configurations.

Yet another advantage is that thermal dissipation can be enhanced for large die packages that use an adhesive film between the leadframe paddle and the die.

Still another advantage is that the present invention prevents mold compound flash that might otherwise cover and insulate leads of the leadframe, particularly inner leads of dual row leadframes.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the large die package method and apparatus of the present invention furnish important and heretofore unknown and unavailable solutions, capabilities, and functional advantages for high performance, large die, miniaturized IC circuit packaging configurations. The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for fabricating a large die package, comprising:
   providing a leadframe having leads and a paddle;
   attaching an interposer onto the leadframe with the interposer extending over at least a portion of the paddle and at least a portion of the leads of the leadframe, with the interposer insulated from the leads, and the interposer being formed from a material selected from a polyimide, a ceramic, a metal, a metal alloy, and a combination thereof; and
   attaching a die to the interposer.

2. The method of claim 1 further comprising providing at least one through-hole through at least the interposer.

3. The method of claim 1 further comprising holding the leads in position with the interposer during encapsulation thereof into a package.

4. The method of claim 1 wherein attaching a die to the interposer further comprises attaching said die with an adhesive layer formed on the interposer or with an epoxy.

5. A method for fabricating a large die package, comprising:
   providing a leadframe having leads and a paddle;
   attaching an interposer onto the leadframe with the interposer extending over the paddle and the lead tips of the leads of the leadframe, with the interposer insulated from the leads, and the interposer being formed from a material selected from a polyimide, a ceramic, a metal, a metal alloy, and a combination thereof;
   adhering the interposer to the lead tips;
   attaching a die to the interposer;
   wire bonding the die to the leads of the leadframe; and
   encapsulating at least portions of the leadframe, the interposer, and the die in a molding compound.

6. The method of claim 5 further comprising providing at least one through-hole through at least the interposer.

7. The method of claim 5 further comprising holding the leads in position with the interposer during encapsulation thereof into a package.

8. The method of claim 5 wherein attaching a die to the interposer further comprises attaching said die with an adhesive layer formed on the interposer or with an epoxy.

9. A large die package, comprising:
   a leadframe having leads and a paddle;
   an interposer attached onto the leadframe with the interposer extending over at least a portion of the paddle and at least a portion of the leads of the leadframe, with the interposer insulated from the leads, and the interposer being formed from a material selected from a polyimide, a ceramic, a metal, a metal alloy, and a combination thereof; and
   a die attached to the interposer.

10. The package of claim 9 further comprising at least one through-hole through at least the interposer.

11. The package of claim 9 wherein the interposer is configured to hold the leads in position during encapsulation thereof into a package.

12. The package of claim 9 further comprising an adhesive layer on the interposer, or an epoxy, attaching the die to the interposer.

13. A large die package, comprising:
   a leadframe having leads and a paddle;
   an interposer attached onto the leadframe with the interposer extending over the paddle and the lead tips of the leads of the leadframe, with the interposer insulated from the leads and adhered to the lead tips, and the interposer being formed from a material selected from a polyimide, a ceramic, a metal, a metal alloy, and a combination thereof;
   a die attached to the interposer;
   the die being wire bonded to the leads of the leadframe; and
   a mold compound encapsulating at least portions of the leadframe, the interposer, and the die.

14. The package of claim 13 further comprising at least one through-hole through at least the interposer.

15. The package of claim 13 wherein the interposer is configured to hold the leads in position during encapsulation thereof into a package.

16. The package of claim 13 further comprising an adhesive layer on the interposer, or an epoxy, attaching the die to the interposer.

* * * * *